United States Patent [19]

Campbell

[11] Patent Number: 4,591,737
[45] Date of Patent: May 27, 1986

[54] MASTER-SLAVE MULTIVIBRATOR WITH IMPROVED METASTABLE RESPONSE CHARACTERISTIC

[75] Inventor: David L. Campbell, Sunnyvale, Calif.

[73] Assignee: Advanced Micro Devices, Inc., Sunnyvale, Calif.

[21] Appl. No.: 449,089

[22] Filed: Dec. 13, 1982

[51] Int. Cl.[4] .................. H03K 3/037; H03K 3/286; H03K 19/003; H03K 19/013

[52] U.S. Cl. .................. 307/272 A; 307/443; 307/481; 307/291; 377/116

[58] Field of Search .......... 307/440, 443, 445, 272 R, 307/272 A, 481, 291, 289, 292; 377/115–117, 119, 120

[56] References Cited

U.S. PATENT DOCUMENTS

| | | | |
|---|---|---|---|
| 3,247,399 | 4/1966 | Moody | 377/116 |
| 3,430,070 | 2/1969 | Marshall, Jr. et al. | 307/272 A X |
| 3,617,776 | 11/1971 | Priel | 307/272 A X |
| 3,814,953 | 6/1974 | Malaviya | 307/272 A X |
| 3,818,251 | 6/1974 | Hoehn | 307/272 A X |
| 3,993,918 | 11/1976 | Sinclair | 377/115 X |
| 4,197,470 | 4/1980 | Banzhaf | 307/272 A X |
| 4,270,062 | 5/1981 | Hanna | 307/272 A |
| 4,289,979 | 9/1981 | Muller | 307/272 A |

FOREIGN PATENT DOCUMENTS 2703903 8/1977 Fed. Rep. of Germany ... 307/272 A

OTHER PUBLICATIONS

Feth et al., "High Performance Implementation of MTL"; IBM Tech. Discl. Bull., vol. 23, No. 9, pp. 4342–4344; 2/1981.

Primary Examiner—Larry N. Anagnos
Attorney, Agent, or Firm—Patrick T. King; Gerald B. Rosenberg; J. Vincent Tortolano

[57] ABSTRACT

A master-slave flip-flop device wherein the master segment employs function and load isolated outputs driven in parallel with cross-coupled latch transistors is described. Signal feed forward may also be provided from a similarly isolated output of the master segment to a device output gate which also receives the otherwise final output of the slave segment. The device is found to exhibit a minimized duration of the undesired metastable state of the master segment and to, thereby, enhance propagation speed in which a stable state is established.

12 Claims, 3 Drawing Figures

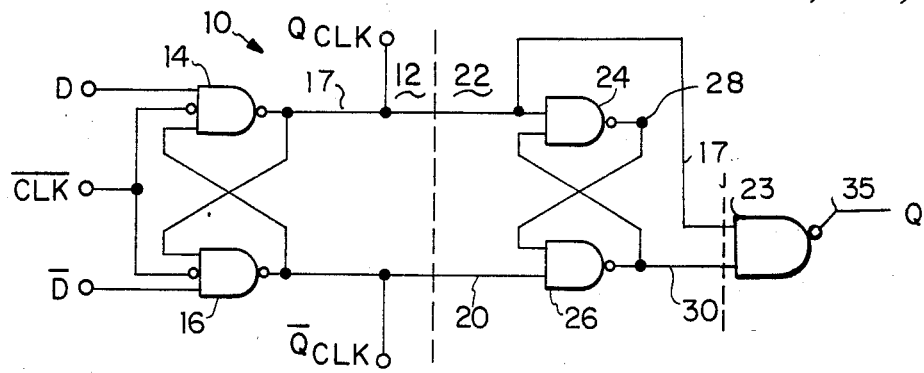
FIG.__1 (PRIOR ART)
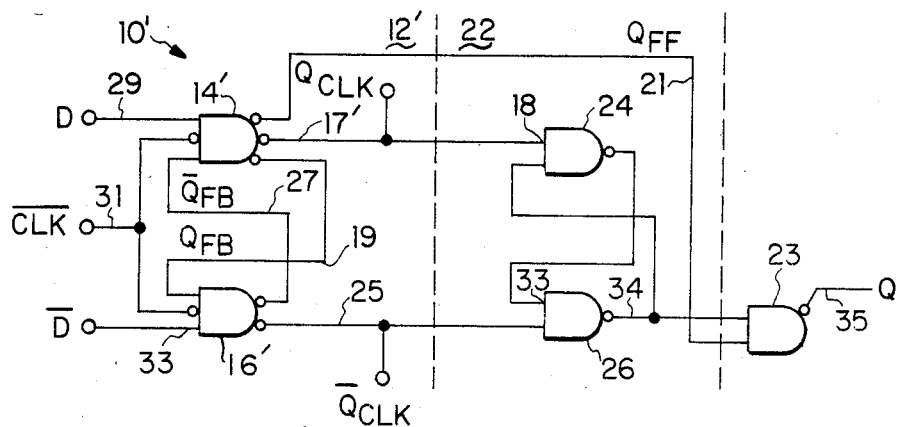
FIG.__2
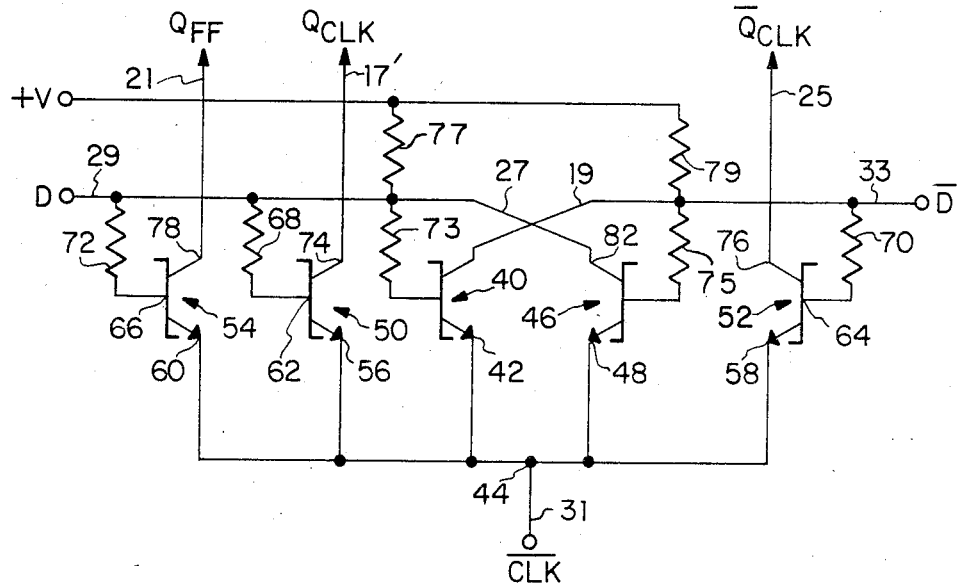
FIG.__3

MASTER-SLAVE MULTIVIBRATOR WITH IMPROVED METASTABLE RESPONSE CHARACTERISTIC

FIELD OF INVENTION

The present invention generally relates to digital logic devices and, in particular, to an edge triggered master-slave flip-flop device constructed of semiconductor circuit elements and having an improved metastable state response characteristic.

BACKGROUND OF THE INVENTION

One of the basic digital devices used in digital circuit design is the master-slave flip-flop. In a master-slave flip-flop, the output binary state of the slave segment is intended to change to match the input binary state of the master segment upon receipt of an external clocking signal. Associated with each output state change of a master segment is a condition of state uncertainty. This condition, typically referred to as a metastable state condition, arises from minimal differences in output voltage levels between typically paired output terminal levels and the defined binary voltage levels, particularly during master output state transition between the defined output levels. It is desirable to minimize the transition time between ambiguous output levels of the master segment in order to reduce the probability that the paired inputs to the slave segment might both be driven toward the same state causing the slave segment to latch to an improper or non-intended binary state. This problem is particularly acute under rapid clock cycling conditions, i.e., at high clock edge rates.

In the prior art, two techniques have been employed to reduce the probability of latch malfunction due to the metastable state during transition of states of the master segment. The first technique has been to electrically speed up the rate of transition of the circuit elements of the master segment. This has been accomplished by using more current to drive the circuit elements of the master segment, thereby overcoming inherent or parasitic capacitance effects which would otherwise retard transition.

The second technique has been to reduce the exposure time, i.e., the time during which the state is considered valid. This is accomplished by assuring an adequate delay between the initiation of a transition in the master segment and the initiation of a clock signal level change, thereby giving the master segment transition a greater proportion of a clock cycle to settle.

Both of these techniques have inherent drawbacks. Timing delays, constraints and limitations are unwanted, and any increase in power consumption is undesirable, particularly in applications wherein the device forms a subcircuit of a larger integrated circuit. What is therefore needed is a master-slave flip-flop device which is not as subject to such inherent physical limitations on device speed.

SUMMARY OF THE INVENTION

In accordance with the present invention, a master-slave flip-flop device having a master segment and a slave segment is provided wherein the master segment employs mutually isolated additional outputs driven in parallel with cross coupled latch transistors. A feed forward signal line may be provided from a buffered output of the master segment to an output gate also receiving the output of the slave segment. In such embodiments, the output gate provides the device output signals.

An advantage of the present invention is that it exhibits a minimized duration of the undesired metastable state of the master segment so that propagation speed of signals through the devices is enhanced without need for an increase in current drive.

Another advantage of the present invention is that in providing an additional buffered feed forward signal in parallel with the state information signals to a gated output of the device, the resulting isolation of the feed forward signal prevents undesired loading of the latching elements of the master segment.

BRIEF DESCRIPTION OF THE DRAWINGS

The invention will be better understood by reference to the following detailed description in conjunction with the accompanying drawings, wherein like reference numerals designate like parts, and wherein:

FIG. 1 is a logic diagram of a prior art master-slave flip-flop;

FIG. 2 is a logic diagram of a master-slave flip-flop according to the present invention; and FIG. 3 is a schematic diagram of a master segment for use in a master-slave flip-flop according to the present invention.

DETAILED DESCRIPTION OF THE INVENTION

Referring to FIG. 1, there is shown a typical master-slave flip-flop with an output gate. The master segment 12 typically comprises a pair of cross-coupled semiconductor clocked gate elements, such as transistor NAND gates 14 and 16, whose outputs are coupled to first and second inputs 18 and 20 of a slave segment 22, and whose outputs are propagated only in the presence of an enabling clock signal $\overline{CLK}$. The slave segment 22 typically comprises a pair of active semiconductor circuit elements, such as third and fourth NAND gates 24 and 26, having complementary outputs 28 and 30 that provide the device output.

An alternative output mechanism may be provided through an output gate 23 which receives a gating signal from a slave output 30 and a feed forward signal through a master output signal line 17. The purpose of the output gate 23 is to isolate the function of the slave segment 22 from the external environment.

The feed forward signal on line 17 is useful to reduce the propagation delay from the initiation of the clock or $\overline{CLK}$ signal to the initiation of the output or Q signal. One of the drawbacks of the use of a feed forward expedient is that the loading on the master output of a conventional master segment 12 significantly degrades the probability that the output of the slave segment 22 will latch to the intended state due to uncertainties resulting from the inherent metastable characteristics of a latch during high speed transition.

Referring to FIG. 2, there is shown a master-slave flip-flop device 10' according to the present invention. The flip-flop device 10' includes a master segment 12' with latching elements and a slave segment 22. The outputs of both the master segment 12' and the slave segment 22 are coupled to a gate 23. The output or outputs of the gate 23 serve as the device output.

The master segment 12' comprises a first gate element 14' and second gate element 16'. Specifically, according to the present invention, a buffered output is provided from the gate elements 14', 16'. The lines from buffered outputs for the first gate element 14' are herein designated $Q_{CLK}$ clock line 17', $Q_{FB}$ line 19 (for feedback) and a $Q_{FF}$ line 21 (for feed forward). The second gate element 16' has two buffered outputs with output lines designated $\overline{Q}_{CLK}$ output line 25 and a $\overline{Q}_{FB}$ line 27. Each of the first and second gate elements 14', 16' accommodate three inputs. The first gate element 14' accommodates data input on a D input line 29 (for data), a clock signal on a $\overline{CLK}$ line 31, and a feedback input coupled to receive a signal on the $\overline{Q}_{FB}$ line 27.

The second gate element 16' accommodates a complementary data input on $\overline{D}$ input line 33, a clock input on clock input line 31 and a feedback signal from $Q_{FB}$ line 19.

The slave segment 22 comprises a third gate element 24 coupled to receive one input signal from $Q_{CLK}$ at an input 18 through clock line 17' and to provide an output signal in feedback to a feedback input 33 of a fourth gate element 26 of the slave segment 22. The fourth gate element 26 is coupled at another input to receive signals from $\overline{Q}_{CLK}$ line 25 and to provide on a signal feedback line 34 to a feedback input of the third gate element 24 and to one input of the dual input device output gate 23. In accordance with the present invention, for purposes to be described in greater detail below, the buffered $Q_{FF}$ line 21 is coupled to the other input of the gate 23 and thereby combined to provide the desired device output signals on Q line 35.

In the genesis of the present invention, it has been found that a master-slave flip-flop device wherein the master segment 12' employs buffered outputs for each of its separate circuit functions including feed forward, even though it provides a feed forward signal to an output gate 23, dramatically decreases the probability of malfunction due to the existence of the metastable or ambiguous state in the outputs of the master segment 12'. Specifically, where a conventional master-slave flip-flop device 10, as in FIG. 1, exhibits an exposure range of 118 millivolts with a peak-to-peak uncertainty range of 236 millivolts and subject to an uncertainty time of 236 picoseconds at an edge rate between inputs D and $\overline{D}$ of one volt per nanosecond, a flip-flop device 10' according to the present invention exhibits an exposure range of only 3.7 millivolts with a 7.4 millivolt peak-to-peak uncertainty range and a 7.4 picosecond uncertainty time.

Turning to FIG. 3, there is shown a schematic diagram of a preferred circuit for a master segment 12' according to the invention which provides the sort of dramatic improvement cited above. The clocked gate elements of FIG. 2 in FIG. 3 comprise Schottky-type transistors, specifically a first transistor 40 having an emitter terminal 42 coupled to a common emitter node 44, and a second transistor 46 having an emitter terminal 48 coupled to the common emitter node 44 with output buffers as hereinafter explained. In addition, there are at least first, second and third buffer means, the first buffer means preferably being a third transistor 50, the second buffer means being a fourth transistor 52 and the third buffer means being a fifth transistor 54, each such transistor 50, 52, 54 having an emitter terminal 56, 58 or 60 coupled to the common emitter node 44. Data input is at a data input node in common with data line 29. Complementary data is provided to a complementary data input node in common with complementary data input line 33.

Base terminals 62, 64 and 66 of the buffer transistors 50, 52 and 54 are coupled through base balancing resistors 68, 70 and 72 to one of the data input nodes 29 or 33. In particular, the third transistor 50 and fifth transistor 54 are coupled to the data input line 29 and the fourth transistor 52 is coupled to the complementary data input line 33.

The latch element consists of transistors 40 and 46, base balancing resistors 73 and 75, and master load resistors 77 and 79. The values of the base balancing resistors 68, 70, 72, 73 and 75 and master load resistors 77 and 79 are selected to satisfy the drive requirements of the individual loads of each of the transistors 40, 46, 50, 52, and 54.

The collector terminals 74, 76 and 78 of the buffer transistors 50, 52 and 54 serve as open collector outputs for subsequent stages. For example, the collector terminal 74 of third transistor 50 is coupled to the $Q_{CLK}$ output line 17'. The collector terminal 76 of fourth transistor 52 is coupled to the $\overline{Q}_{CLK}$ output line 27. The collector terminal 78 of fifth transistor 54 is coupled to the $Q_{FF}$ feed forward line 21.

First transistor 40 has a collector terminal 80 coupled to the complementary data input line 33 through line 19. Second transistor 46 has a collector terminal 82 coupled to the data input line 29 through line 27. The collector outputs of each of the transistors 40, 46, 50, 52 and 54 are such that the outputs are isolated from one another. Therefore, the loading of any one of the transistor outputs does not affect or in any way degrade the function of any other transistor output. Thus, by tailoring the base balancing resistors, each tansistor collector output can be matched to the specific current load that it is to separately sink from the slave segment, thereby providing independent load isolation; the slave segment input current loads varying depending on the number of inputs supported by any corresponding input gate and whether the input gate is optimized for speed, reduced power dissipation or increased power handling capability, all of which may be determined in the initial development of the device. Further, the base balancing resistors 68, 70, 72 of the buffer transistors 50, 52, 54 effectively decouple their respective base electrodes 62, 64, 66 from one another by permitting different respective current flows therethrough. The high gain of even the preferred Schottky barrier transistors further results in little or no loading of the master latch so as to permit each of the buffer transistors 50, 52, 54 to effectively sense the logic state of the master latch and generate a corresponding, effectively isolated current sink logic state.

A device with a master segment according to the present invention operates by progressing through a number of different functional or operational states. First, the master segment receives and latches set-up signals to specify the state to which active circuit elements of the slave segment are to be set at input clock transition. Second, the master segment, when clocked, propagates the logic state information to the slave segment isolated from the logic state of the master segment. Third, the master segment, when clocked, may provide an additional buffered feed forward signal in parallel with the logic state information signals to a gated output of the device. Isolation of the feed forward signal prevents undesired loading of the latching elements of the master segment.

In greater detail, to latch from low to high at Q line 35, data applied on lines 29 and 33 is propagated through the first, second and third buffers 50, 52, 54 at the initiation of a change in the $\overline{CLK}$ clock signal on line 31. A signal through third transistor 54 is propagated in isolation from the latch element (transistors 40 and 46) through a feed forward line 21 to the output gate 23 (FIG. 2). Confluence of two active input signals produces a device output signal on output line 35. The state of the master segment 12 is thus conveyed to the output within a period equal to two gate delays less than would otherwise occur in a master-slave flip-flop device without feed forward.

Thus, a master-slave logic device that substantially reduces the likelihood of metastable state induced improper operation at high clock rates has been described.

Although the present invention has been described in detail with reference to its preferred embodiment, those of ordinary skill will readily appreciate that many modifications and variations of the present invention are possible and contemplated. Accordingly, it is therefore to be understood that the present invention may be practiced otherwise that as specifically described and within the scope of the appended claims.

I claim:

1. A master stage of a logic device for providing logic outputs, as logic input controlling loads, to logic inputs of a slave stage, said master stage being responsive to a clock signal and to complementary first and second master data signals, said master stage comprising:
   (a) master latch means for latching a master logic state including first and second master transistors respectively having a control electrode, a common electrode and a controllable logic state electrode, said first and second master transistor control electrodes resistively receiving said first and second master data signals, respectively, said first and second master transistor controllable logic state electrodes being respectively coupled so as to respectively provide said second and first master data signals, and said common electrodes being coupled to commonly receive said clock signal;
   (b) first buffer means for generating a first logic output corresponding to said master logic state and for providing said first logic output to a respective first logic input of said slave stage such that said first logic input is independent load isolated from other logic inputs of said slave stage receiving logic outputs from said master stage; and
   (c) second buffer means for generating a second logic output corresponding to said master logic state and for providing said second logic output to a respective second logic input of said slave stage such that said second logic input is independent load isolated from other logic inputs of said slave stage, said first and second buffer means generating said first and second logic outputs as the true and complement logic states, respectively, of said master logic state.

2. The master stage of claim 1 further comprising third buffer means for generating a third logic output corresponding to said master logic state and for providing said third logic output to a respective third logic input of said slave stage such that said third logic input is independent load isolated from other logic inputs of said slave stage.

3. The master stage of claim 2 wherein said slave stage includes an output gate, wherein said third logic input is a feed forward logic input of said output gate and wherein said third buffer means provides said third logic output as a feed forward logic input to said slave stage.

4. The master stage of claim 2 wherein second and third buffer means respectively comprise transistors having a control electrode, a common electrode and a controllable logic state electrode responsive to said control electrode, each said control electrode being resistively coupled to respective master transistor controllable logic state electrodes of said master latch means so as to be responsive to said master logic state, said controllable logic state electrodes of said second and third buffer means being respectively coupled to said second and third logic inputs of said slave stage.

5. The master stage of claim 1 wherein said first buffer means comprises a transistor having a control electrode, a common electrode and a controllable logic state electrode responsive to said control electrode, said control electrode being resistively coupled to a respective master transistor controllable logic state electrode of said master latch means so as to be responsive to said master logic state and said controllable logic state electrode of said first buffer means being coupled to said first logic input of said slave stage.

6. In a flip-flop device having a master and a slave stage, said master stage including means for latching data in response to a clock signal and wherein said latching means comprises first and second gate elements having respective first and second gate control means for sensing data and first and second gate output means for outputting data, said first and second gate control means and said first and second gate output means being cross-coupled so as to provide for the latching of data and whereupon the latched data is provided to said slave stage, an improvement in said master stage comprising:
   (a) first means for generating first data corresponding to said latched data and for providing said first data to said slave stage while providing for the independent load isolation of said first data with respect to said latched data, said first generating means being resistively coupled to said second gate output means of said latching means so as to permit the sensing of said latched data; and
   (b) second means for generating second data corresponding to the complement of said latched data and for providing said second data to said slave stage while providing for the independent load isolation of said second data with respect to said latched data and said first data, said second generating means being resistively coupled to said first gate output means of said latching means so as to permit the sensing of said latched data.

7. The device of claim 6 wherein said first generating means comprises a third gate element having a third gate control means for sensing data and a third gate output means for outputting data generated by said third gate element, said third gate control means being resistively coupled to said second gate output means of said latching means, so as to be responsive to said latched data, and said third output means being coupled to said slave stage.

8. The device of claim 7 further comprising third generating means for respectively generating third data corresponding to said latched data and for providing said respective third corresponding data to said slave stage while providing for the respective independent load isolation of said third corresponding data of said third generating means with respect to said latched data and that of said first and second data, said third generating means being resistively coupled to said second gate output means of said latching means so as to permit the sensing of said latched data.

9. The device of claim 8 wherein said second and third generating means respectively comprise fourth and fifth gate elements having fourth and fifth gate control means for sensing data and fourth and fifth gate output means for outputting data generated by said first and second gate elements, said fourth and fifth gate control means being resistively coupled to said first and second gate output means of said latching means, respectively, and said fourth and fifth output means being coupled to said slave stage.

10. The device of claim 9 wherein said first, second, third, fourth and fifth gate elements comprise Schottky-type transistors.

11. A master-slave flip-flop having a master and a slave stage, said master stage being responsive to a clock signal and complementary binary state input data provided thereto, said flip-flop comprising:
(a) means for latching said input data in response to said clock signal, said latching means further including means for respectively providing data corresponding to the true and complementary states of said input data; and (b) a master stage output buffer including:
  (i) first, second and third transistors respectively having first, second and third control electrodes, first, second and third common electrodes for receiving said clock signal in common and first, second and third controllable state electrodes coupled separately to said slave stage; and
  (ii) first, second and third resistor means for resistively coupling said latching means to said first, second and third control electrodes such that said first and second transistors provide output data corresponding to either said true or complementary input data from said first and second controllable state electrodes while said third transistor provides output data from said third controllable state electrode corresponding to the complement of the output data provided by said first and second transistors.

12. The flip-flop of claim 11 wherein said latching means comprises fourth and fifth transistors respectively having fourth and fifth control electrodes for respectively sensing said complementary binary state input data, fourth and fifth common electrodes for receiving said clock signal in common and fourth and fifth controllable state electrodes for respectively asserting said complementary binary state input data.

* * * * *